United States Patent
Quach et al.

(10) Patent No.: US 9,983,930 B2
(45) Date of Patent: May 29, 2018

(54) SYSTEMS AND METHODS FOR IMPLEMENTING ERROR CORRECTING CODE REGIONS IN A MEMORY

(71) Applicant: QUALCOMM INCORPORATED, San Diego, CA (US)

(72) Inventors: Nhon Quach, San Jose, CA (US); Yanru Li, San Diego, CA (US); Rahul Gulati, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/243,623

(22) Filed: Aug. 22, 2016

(65) Prior Publication Data
US 2018/0032394 A1    Feb. 1, 2018

Related U.S. Application Data

(60) Provisional application No. 62/367,720, filed on Jul. 28, 2016.

(51) Int. Cl.
*H03M 13/00* (2006.01)
*G06F 11/10* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/0619; G06F 3/064; G06F 3/0679
See application file for complete search history.

(56) References Cited

U.S. PATENT DOCUMENTS 8,151,163 B2 * 4/2012 Shalvi ................. G06F 11/1068
714/709
8,259,497 B2 * 9/2012 Shalvi ..................... G11C 11/56
365/185.02
(Continued)

FOREIGN PATENT DOCUMENTS

WO      2011031260 A1    3/2011

OTHER PUBLICATIONS

International Search Report and Written Opinion—PCT/US2017/039816—ISA/EPO—dated Oct. 27, 2017.

*Primary Examiner* — Esaw T Abraham
(74) *Attorney, Agent, or Firm* — Smith Tempel Blaha LLC

(57) ABSTRACT

Systems and methods are disclosed for implementing error correction control regions (ECC) in a memory device without the need to ECC protect the entire memory device. An exemplary method comprises defining one or more ECC regions in a memory device, the memory device coupled to a system on a chip (SoC). An ECC block is provided on the SoC, the ECC block in communication with the one or more ECC regions in the memory device. A determination is made with the ECC block whether to store data in a first of the one or more ECC regions. Responsive to the determination ECC bits are generating for, and interleaved with, the received data and interleaved ECC bits and data are caused to be written to the first ECC region. Otherwise, received data is sent to a non-ECC region of the memory device.

24 Claims, 10 Drawing Sheets

(51) Int. Cl.
  *G11C 29/04* (2006.01)
  *G11C 29/52* (2006.01)
  *G06F 3/06* (2006.01)

(52) U.S. Cl.
  CPC ............ *G06F 3/0679* (2013.01); *G11C 29/04* (2013.01); *G11C 29/52* (2013.01)

(56) References Cited

U.S. PATENT DOCUMENTS

| | | | |
|---|---|---|---|
| 8,281,065 B2* | 10/2012 | Byom | G06F 12/0246 |
| | | | 711/103 |
| 8,806,112 B2* | 8/2014 | Somanache | G06F 12/0246 |
| | | | 711/103 |
| 8,918,700 B2* | 12/2014 | Campbell | G06F 11/1012 |
| | | | 714/704 |
| 8,959,417 B2* | 2/2015 | Zhu | G06F 11/1048 |
| | | | 714/768 |
| 9,003,102 B2* | 4/2015 | Lassa | G06F 3/061 |
| | | | 711/103 |
| 9,141,473 B2* | 9/2015 | Luo | G06F 11/1048 |
| 9,183,078 B1* | 11/2015 | Zhu | G06F 11/10 |
| 9,268,632 B2* | 2/2016 | Linstadt | G06F 11/1048 |
| 9,268,686 B2* | 2/2016 | Linkewitsch | G06F 12/0246 |
| 9,425,829 B2* | 8/2016 | Ramaraju | G06F 3/0683 |
| 2006/0117239 A1 | 6/2006 | Lin et al. | |
| 2013/0262958 A1 | 10/2013 | Ruggiero et al. | |
| 2015/0301890 A1 | 10/2015 | Marshall et al. | |

* cited by examiner

SYSTEMS AND METHODS FOR IMPLEMENTING ERROR CORRECTING CODE REGIONS IN A MEMORY

PRIORITY CLAIM AND CROSS-REFERENCE TO RELATED APPLICATION

This patent application claims priority under 35 U.S.C. § 119(e) to U.S. Provisional Application Ser. No. 62/367,720, filed Jul. 28, 2016, entitled, "SYSTEMS AND METHODS FOR IMPLEMENTING ERROR CORRECTING CODE REGIONS IN A MEMORY," the entire contents of which are hereby incorporated by reference.

DESCRIPTION OF THE RELATED ART

Computing devices comprising at least one processor coupled to a memory are ubiquitous. Computing devices may include personal computing devices (e.g., desktop computers, laptop computers, cellular telephones, smart phones, tablet computers, portable digital assistants (PDAs), and portable game consoles), or may be included as components of larger products (e.g. appliances, automobiles, airplanes, military or construction equipment, etc.). Various products containing computing devices may be subject to regulations or standards that set requirements for the memory used in the product, including the use of error correcting code (ECC) for the memory, such as a LPDDR (low power double-data rate) DRAM (dynamic random access memory) or NOR flash non-volatile memory. One example of such a standard is ISO 26262, a functional safety standard for automobiles, entitled "Road vehicles—Functional safety," which sets standards and requirements for memories used in automotive electric/electronic systems, which dictates the need for ECC in the LPDDR DRAM memory or NOR flash non-volatile memory.

In order to meet these standards or regulation (such as ISO 26262) LPDDR DRAM memory or NOR flash non-volatile memory often needs to be custom designed to meet the particular requirements for the product and/or application in which these devices may be used. However, such customized LPDDR DRAM memory or NOR flash non-volatile memory is costly to design and manufacture. For example, implementing full ECC protection for a single ×32 LPDDR memory device requires adding another LPDDR device for storing the ECC bits, requiring an extra memory controller and a memory device. To implement ECC in NOR flash non-volatile memory, ECC bits must be added to the internal non-volatile memory array, increasing the area cost. Yet another approach is to use an on-chip SRAM (Static Random Access Memory) memory buffer with ECC to meet the standards or regulations. This approach is also costly as SRAM memory buffer is typically 10 times more expensive than LPDDR memory on a cost per bit basis.

Accordingly, there is a need for improved systems and methods to implement ECC region(s) in the memory of computing devices, especially regions in a memory used in a computing device that is part of an automotive electric and/or electronic system.

SUMMARY OF THE DISCLOSURE

Systems, methods, and computer programs are disclosed for implementing error correction control (ECC) regions in a memory such as a DDR DRAM/LPDDR (Low Power DDR) DRAM in communication with a system on chip (SoC). In an embodiment, one or more ECC regions are defined in a memory device, the memory device coupled to a system on a chip (SoC). An ECC block is provided on the SoC, the ECC block in communication with the one or more ECC regions in the memory device. A determination is made with the ECC block whether to store data in a first of the one or more ECC regions. Responsive to the determination ECC bits are generating for, and interleaved with, the received data and interleaved ECC bits and data are caused to be written to the first ECC region. Otherwise, received data is sent to a non-ECC region of the memory device.

In another embodiment a system is disclosed comprising a memory device with one or more ECC regions defined within the memory device. The system also comprises a system on a chip (SoC) coupled to the memory device. The system includes an ECC block on the SoC, the ECC block in communication with the one or more ECC regions. The ECC block contains logic configured to determine whether to store data in a first of the one or more ECC regions. If the determination is to store the data in the first ECC region the logic is configured to generate ECC bits for the received data, interleave the generated ECC bits with the received data, and causing the interleaved ECC bits and data to be written to the first ECC region. Otherwise, the logic is configured to send the received data to a non-ECC region of the memory device if the determination is to not store the data in the first ECC region.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

Figure 1:
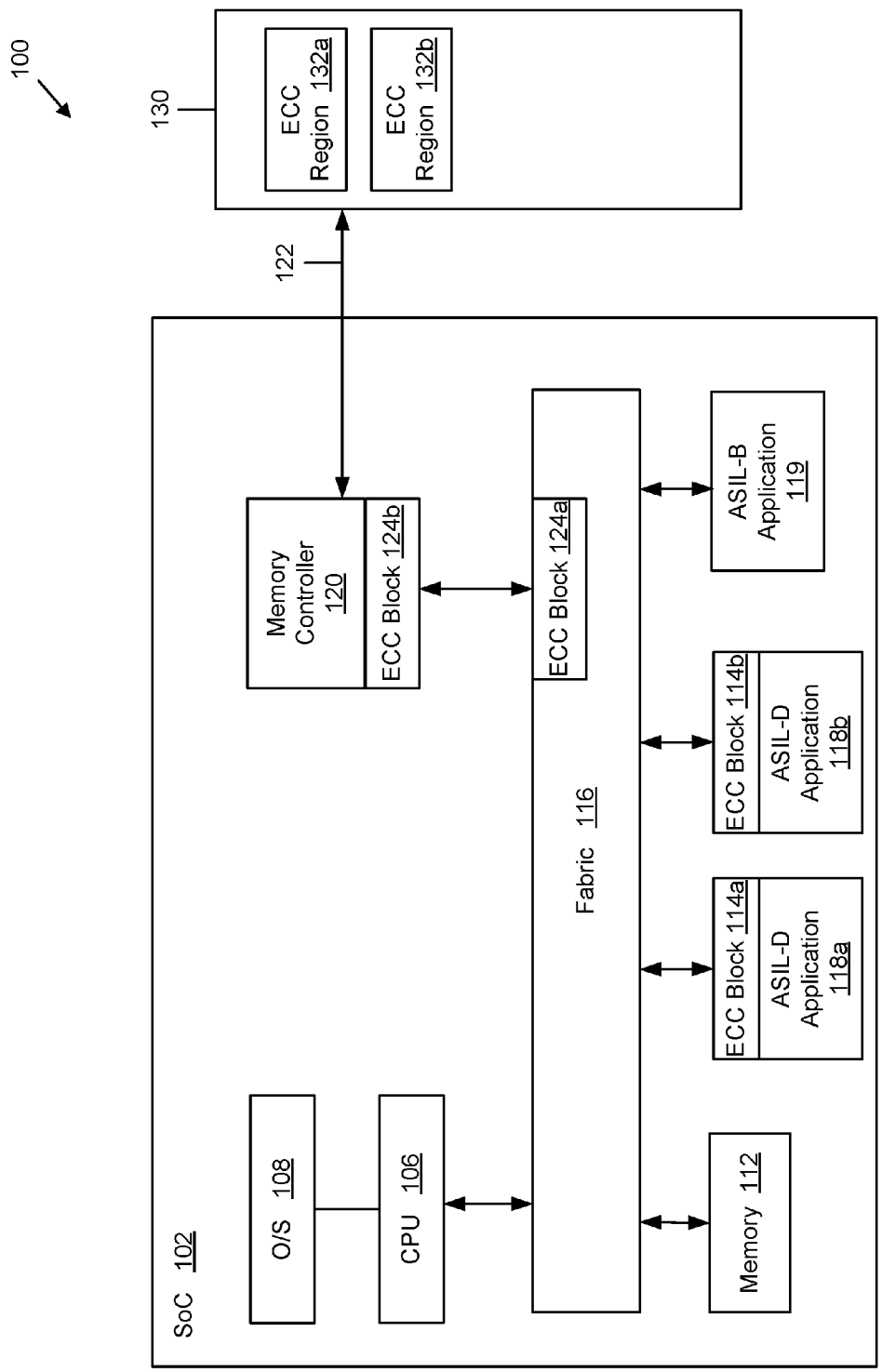
FIG. 1 is a block diagram of an embodiment of a system for implementing error correction control (ECC) regions in a memory in communication with a system on chip (SoC) of an exemplary computing device.

The word "exemplary" is used herein to mean "serving as an example, instance, or illustration." Any aspect described herein as "exemplary" is not necessarily to be construed as preferred or advantageous over other aspects.

In this description, the term "application" or "image" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the term "computing device" is used to mean any device implementing a processor (whether analog or digital) in communication with a memory, whether the computing device is a "stand alone" device such as a computer (including desktop computers, servers, laptop computers, handheld computers, tablets, etc.). "Computing device" also includes a processor in communication with a memory that is a part, portion, or component of a larger product, such as appliances, automobiles, airplanes, military or construction equipment, etc. A "computing device" may also be a "portable computing device" (PCD) and the terms PCD, "communication device," "wireless device," "wireless telephone", "wireless communication device," and "wireless handset" are used interchangeably herein. With the advent of third generation ("3G") wireless technology and four generation ("4G"), greater bandwidth availability has enabled more portable computing devices with a greater variety of wireless capabilities. Therefore, a portable computing device may also include a cellular telephone, a pager, a PDA, a smartphone, a navigation device, or a hand-held computer with a wireless connection or link.

Memory accesses in computing devices (CDs), and especially memory accesses by a system on a chip (SoC) and a memory located external to the SoC ("off chip") are typically performed by a high performance access channel. Data is transferred between a processor (or another component of the CD) and a memory device over the access channel. A variety of standards, protocols, or technologies may be used to perform the transfer of the data and this disclosure is not limited to any particular data transfer standard. Additionally, the memory devices discussed herein may be any memory device, such as for example a dynamic random access memory (DRAM) like a double data rate synchronous dynamic (DDR) RAM according to one of the DDRx or LPDDRx (Low Power DDR) standards as for example those published by the JEDEC (Joint Electron Device Engineering Council).

Typically used in desktops and servers, DDR DRAM memory devices have an IO (input/output) data bus width of 4 bits (×4) or 8 bits (×8). LPDDR DRAM memory devices have an IO data bus width of 16 bits (×16) and 32 bits (×32). Additionally, the size of the data bus width between the computing device and the DRAM memory in a channel also varies. For desktop computers, the data bus width is 64 bits per channel, requiring up to 8 pieces of ×8b DDR DRAM memory devices. For servers, the data bus width is 64 bits per channel, requiring up to 16 pieces of ×4 DDR DRAM memory devices or 8 pieces of ×8b DDR DRAM memory devices. For tablets, cellphones, and automotive, the data bus width is 32 bits, requiring two pieces of ×32b or a single piece of ×32b (or a 2×16b) LPDDR DRAM memory device(s).

Memory devices in communication with an SoC may also be protected by error correcting/correction code (ECC). ECC comprises extra bits sent or stored with the data being stored on the memory that assist in detecting transmission or other errors when the data stored on the memory is read or retrieved from the memory. In typical computing devices the memory device is sized to store the ECC bits in addition to the data being held by the memory device. Similarly, the bandwidth of the memory device access channel is sized to allow for the transmission of the ECC bits along with the data being sent to/retrieved from the memory device. For example, some computing devices use memory devices comprising dual in-line memory module (DIMM) with 8 pieces of ×8b memory for data storage and 1 piece of ×8b memory for ECC storage. Such 9×8b DIMMs may be coupled to the SoC or processor with a 72 bit memory access channel using 64b for data and 8b for ECC.

However, some applications or products in which a memory device is used may not allow for such conventional memory/memory access channel arrangements. For example, ISO 26262 is a functional safety standard for automobiles, entitled "Road vehicles—Functional safety," which sets standards and requirements for memory devices used in automotive electric/electronic systems, including the use of ECC in the memory. Some of these requirements are found in Automotive Safety Integrity Level (ASIL)-A through ASIL-D which define varying integrity and performance levels required for memory devices to comply with ISO 26262. Under these standards such as ASIL-D, more common ×8b memory are not permitted, but instead a 2×16b memory is required (and a 32b memory access channel), along with ECC. Rather than allowing manufacturers to add another ×8b memory for the ECC bit storage (and another 8 bits to the channel) as commonly done for other applications, the requirements in ASIL-A through ASIL-D force the implementation of a second piece of 2×16b memory (and another 32 bit channel) in order to provide ECC for the memory device. Implementation of ECC in this manner requires adding another ×32b or 2×16b memory device, doubling the cost.

Implementing ECC in this manner also requires either the use of an on-chip SRAM buffer for the ECC data to be stored in the memory device, or trying to protect the entire memory device with ECC protection, both of which further add to the cost of providing ECC under these standards. As will be understood, the same problems are faced in any computing device (e.g. a tablet or cellphone) where ECC protection is desired for an off-chip memory device.

The system and methods of the present disclosure implement ECC protected regions or portions of a memory device in communication with the SoC, rather than providing ECC protection for the entire memory device. These regions may be associated with one or more applications for which ECC protection is required, such as applications operating under a standard such as ASIL-D. The ECC protected regions are allocated as a larger area, such as 2× (times), the area required for the data generated by the ASIL-D or other application. The system and methods also implement ECC blocks containing logic to allow ECC bits to be generated for any desired granularity of data.

For example, in a write transaction by the ASIL-D application, ECC bits may be generated for the smallest granularity of read/write requests by the application, such as 1 Byte of data. The generated ECC bits are then interleaved with the data, such as by appending the ECC bits onto each 1 Byte of data, and the interleaved data+ECC bits are stored in the ECC region of the memory device. For read transactions, the ECC blocks contain logic to allow the ECC bits to be retrieved along with the data and for any necessary ECC correction. The retrieved data may then be returned to the data requestor. At the same time, write and read transactions from other applications that do not require ECC protected data may bypass the ECC blocks and write/read data to non-ECC protected regions of the memory device.

In this manner, the systems and methods allow for both non-ECC protected and ECC protected data (as well as the accompanying ECC bits) to be implemented in a single piece of memory and single memory access channel—in compliance with ASIL-A through ASIL-D—rather than the commonly used two pieces of memory and double memory access channels. Further, the systems and methods allow for an inexpensive (both in terms of costs and processing time) way to provide ECC protection for only a portion of a memory device, avoiding the need for ECC protecting an entire memory device and/or providing a separate ECC protected memory device.

As will be understood, cost savings from the present systems and methods can be considerable. In addition to the significant $1-$2 cost savings using one piece of DRAM rather than two separate pieces (e.g. one piece for ECC protected data and another piece for non-ECC protected data), using one piece of DRAM provides a net bandwidth reduction of 15% due the bandwidth savings of only having to refresh a single piece of memory rather than two pieces. The bandwidth reductions/savings are even more pronounced in certain applications like automotive were the increased operating temperatures require higher refresh rates for the memory, including four times higher. Similarly, there are savings in silicon area, such as pads no longer needed to support the second piece of DRAM memory as well as packaging savings in terms of bumps and balls no longer needed that also represent significant reductions in materials and manufacturing costs.

Although discussed herein in relation to computing devices used in automotive electronics, such as for compliance with the ASIL-A through ASIL-D standards, the systems and methods herein—and the considerable savings made possible by the systems and methods—are applicable to any computing device, including portable computing devices (PCDs).

FIG. 1 illustrates an embodiment of a system 100 for implementing error correction control (ECC) regions 132a-132b in a memory device 130 in communication with a system on chip (SoC) 102. The system 100 may be implemented in any computing device, including a personal computer, a workstation, a server, a portable computing device (PCD), such as a cellular telephone, a portable digital assistant (PDA), a portable game console, a tablet computer, or a wearable computer. The system 100 may also be implemented in a computing device that is a portion/component of another product such as an appliance, automobile, airplane, construction equipment, military equipment, etc.

As illustrated in the embodiment of FIG. 1, the system 100 comprises an SoC 102 electrically coupled to an external or "off chip" memory device 130. The SoC 102 comprises various on-chip components, including a central processing unit (CPU) 106, a memory controller 120, a system memory 112, all interconnected via Fabric 116. Fabric 116 may comprise any collection of interconnects, buses, and/or wires, regardless of topology. Fabric 116 may also include additional components such as caches (not illustrated). In some embodiments, the SoC 102 may also include one or more additional processors such as an additional CPU, a graphics processing unit (GPU), a digital signal processor (DSP), a graphics processing unit (GPU), an analog processor or other processer also connected to Fabric 116.

The CPU 106 may be controlled by or execute an operating system (OS) 108 that causes the CPU 106 to operate or execute various applications, programs, or code stored in one or more memory of the computing device. System memory 112 may be a static random access memory (SRAM), a read only memory (ROM) 112, or any other desired memory type, including a removable memory such as an SD card. The SoC 102 may include one or more memory clients that request memory resources from memory device 130 located external to the SoC 102 or "off chip." The memory clients may comprise one or more processing units (e.g., CPU 106, a GPU, a DSP, etc.), a video encoder, or other clients/components of the SoC 102 requesting read/write access to the memory device 130.

These memory clients, may, as illustrated in FIG. 1 also include applications, such as one or more ASIL-D applications 118a-118b, ASIL-B applications 119, or other applications. ASIL-B and ASIL-D refer to various Automotive Safety Integrity Level (ASIL)-A through ASIL-D which define varying integrity and performance levels required for memory devices to comply with ISO 26262. As will be understood by one in the art, an ASIL-B application 119 will not require that the data written and/or read be ECC protected. Contrarily, one of ordinary skill understands that ASIL-D applications 118a-118b require that the data written and/or read be ECC protected. As will also be understood, FIG. 1 is illustrative and more or fewer applications may be executing on or by SoC 102 at a given time, and in some time periods no ASIL-D applications 118a-118b will be active or executing.

The SoC 102 further includes a memory controller 120 electrically connected to the Fabric 116 and also connected to the memory device 130 by a memory access channel 122 which may be a serial channel or a parallel channel in various embodiments. Memory controller 120 manages the data read from and/or stored to the various memories accessed by the SoC 102 during operation of the system 100, including memory device 130 illustrated in FIG. 1. In the illustrated embodiment of FIG. 1, the memory controller 120 may include other portions not illustrated such as a read and/or write buffer, control logic, etc., to allow memory control 120 to control the data transfer over the memory access channel 122. In various implementations, some or all of the components of the memory controller 120 may be implemented in hardware, software, or firmware as desired.

The memory device 130 interfaces with the SoC 102 via a high-performance memory bus comprising an access channel 122, which may be any desired width. The memory device 130 may be any volatile or non-volatile memory, such as, for example, DRAM, flash memory, flash drive, a Secure Digital (SD) card, a solid-state drive (SSD), or other types. In an embodiment, the memory device 130 is a DDR DRAM or a LPDDR DRAM. Additionally, as further illustrated in FIG. 1, memory device 130 may include one or more ECC Regions 132 for storing the data written to the memory device 130 that requires ECC protection. In various embodiments, the ECC Regions 132a, 132b may vary in size, ranging from 512 KB to 64 MB as desired. It will be understood that in embodiments with multiple ECC Regions 132a, 132b each ECC Region 132a, 132b may be a different size than one or more of the other ECC Regions 132.

Although two ECC Regions 132a, 132b are illustrated in FIG. 1, more or fewer ECC Regions 132 may be provided in different embodiments, or at different times, such as during memory map allocation. For example, in an embodiment, ECC Regions 132a, 132b may be dynamically allocated or provided in the memory device 130, such as when an application requiring ECC data protection (such as ASIL-D application 118a or 118b) becomes active or begins executing on SoC 102. In such embodiments, when one or more application requiring ECC data protection is no longer active or executing on SoC 102, one or more ECC Regions 132a, 132b may then be de-allocated or reclaimed for general use—e.g. to store non-ECC protected data.

In other embodiments, one or more ECC Regions 132a, 132b may be static—i.e. allocated or defined at a set time such as at SoC 102 start-up—and remain defined or allocated until the SoC 102 is re-started without consideration of which applications are operating/executing on the SoC 102. Regardless of whether allocated or defined statically or dynamically, ECC Region(s) 132 are defined to be twice the expected needed ECC protected region. For example, depending on the use to which the SoC 102 is being put, such as executing multiple ASIL-D applications 118a, 118b, it may be expected that an ECC protected region or portion of "X" MB size will be sufficient to service the ASIL-D applications 118a, 118b.

For the present systems and methods, one or more ECC Regions 132a, 132b of "2×" MB size are instead defined or allocated because, as discussed below, each ECC Region 132 stores the data for which ECC protection is required, along with the ECC bits for the smallest granularity of data read/write access. Assuming a 1B data read/write access, ECC bits will be generated for and stored with each 1B of data, essentially doubling the required size of the ECC Regions 132a, 132b. In other embodiments, if the smallest read/write access granularity is 2 bytes, only 8 ECC bits of ECC is needed to protect both bytes, allowing for a smaller than 2× allocation or definition of the ECC Regions 132a, 132b.

Other portions or partitions of memory device 130 store data for which ECC protection is not required, such as data written or accessed by ASIL-B application 119. Note that in some embodiments the system 100 may include more than one memory device 130. In such embodiments, ECC Regions 132a, 132b may be provided or allocated on less than all of the memory device(s) 130. As will be understood, the memory device 130 may be any type of DDR memory and may be a dual in-line memory module (DIMM) comprised of one or more memory arrays arranged within the memory device 130 to store data. These memory arrays may be arranged in ranks in some embodiments as would be understood.

In an embodiment, the memory device 130 may be a LPDDR4 2×16 memory device 130 with a 32b access channel 124, and such memory device 130 may comply with ISO 26262 and/or one or more of ASIL-A through ASIL-D. However, other types and configurations of the memory device 130 may be implemented in the system 100 in other embodiments. As will be understood, in embodiments with multiple memory devices 130, it is not necessary that each memory device 130 be the same type or memory or be arranged in the same manner as the other memory devices 130.

Memory device 130 may be used to store any type of data desired and may be written to/read from by any component or memory client of the SoC 102 requesting access to the memory device 130. In an embodiment, the memory device 130 may be written to/read from by one or more of ASIL-D application 118a, 118b, ASIL-B application 119, and other applications executing or operating on the SoC 102.

For ASIL-D application 118a, 118b or other applications requiring ECC data protection, the data and ECC bits for the data are written to one or more of ECC Regions 132a, 132b. To provide this ECC data protection the system 100 also includes one or more ECC blocks 114, 124. In some embodiments ECC data protection may be provided on the "master" side as illustrated by ECC Blocks 114a, 114b. For such embodiments the ECC Blocks 114a, 114b may comprise logical components located between the applications requiring ECC data protected data (such as ASIL-D applications 118a, 118b) and the Fabric 116. As will be understood, it is not necessary that each application have its own ECC Block 114, and multiple applications may share a single ECC Block 114. ECC Blocks 114a, 114b may comprise hardware, software, or firmware as desired.

In other embodiments, ECC data protection may instead, or additionally, be provided on the "slave" side as illustrated by ECC Blocks 124a, 124b. In such embodiments, the "slave" side protection may be provided by one or more ECC Blocks 124a that are part of, or located between the Fabric 116 and the memory controller 120. In other implementations, the "slave" side protection may instead or additionally be provided by one or more ECC Blocks 124b that are part of or located with memory controller 120. ECC Blocks 124a, 124b may comprise hardware, software, or firmware as desired Some embodiments may implement only one or more "master" side ECC Blocks 114a, 114b, while other embodiments may only implement one or more "slave" side ECC Blocks 124a, 124b. Yet other embodiments may implement a combination of "master" and "slave" side ECC data protection.

Figure 2:
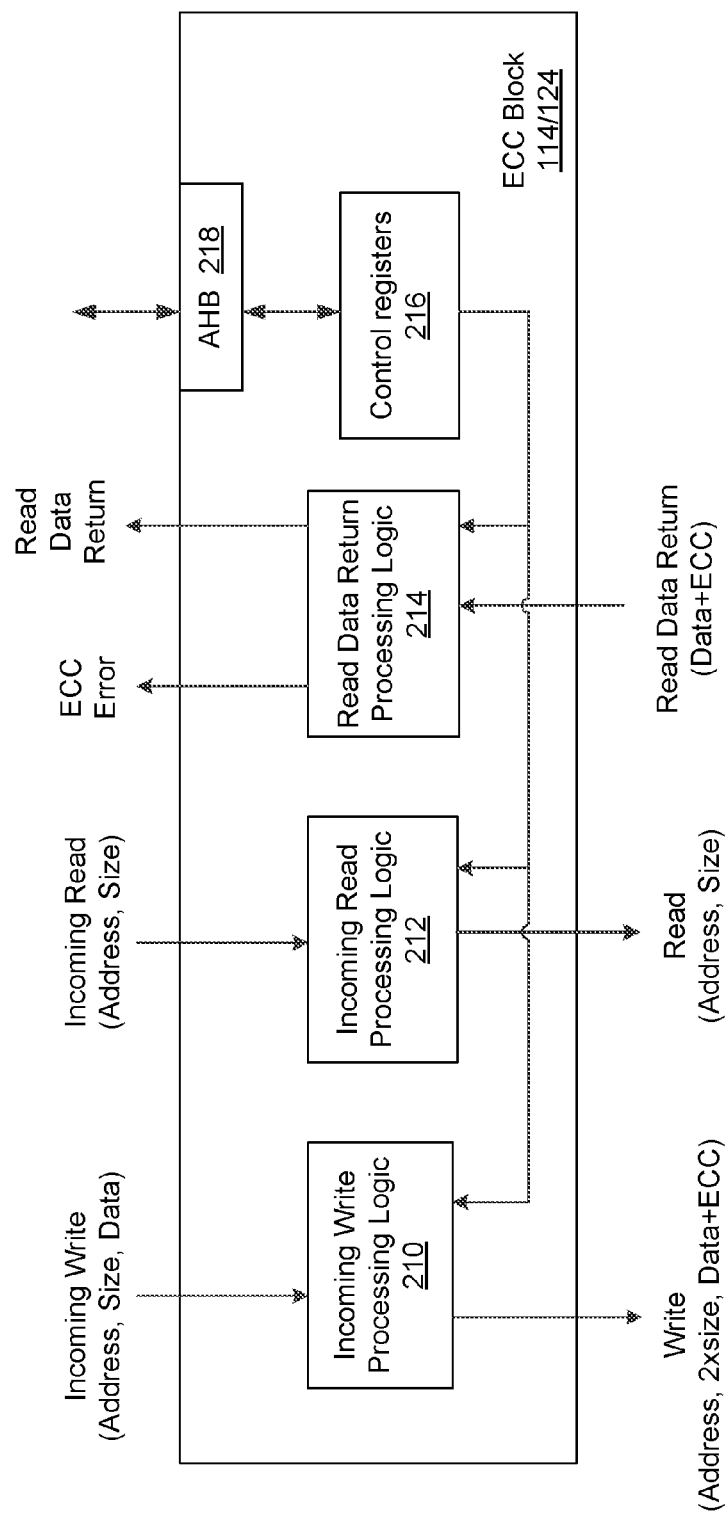
FIG. 2 is a block diagram showing additional details of an exemplary ECC Block of the system of FIG. 1.

Turning to FIG. 2, an exemplary embodiment of an ECC Block 114/124 is illustrated. As shown in FIG. 2, an exemplary ECC Block 114/124 may include Incoming Write Processing Logic 210 ("Write Logic" 210), Incoming Read Processing Logic 212 ("Read Logic" 212), and Read Data Return Processing Logic ("Data Return Logic" 214), all in communication with Control Registers 216 that may be set or configured by a processor, such as CPU 106 of FIG. 1. Control Registers 216 may comprise in an embodiment at least a base register indicating the smallest memory addresses of one or more ECC Region 132a, 133b of memory device, and a length register indicating the size of the ranges of one or more ECC Region 132a, 133b. Control Registers 216 and/or the other components of ECC Block 114/124 may be coupled to and in communication with a high performance bus AHB 218 to provide communications to and from the ECC Block 114/124. As will be understood, not every ECC Block 114/124 of FIG. 1 may include the elements or components illustrated in FIG. 2. In some implementations, one or more of ECC Blocks 114/124 of FIG. 1 may include fewer or more elements of components than the exemplary embodiment of FIG. 2 and/or the functionality of one or more illustrated components may be combined into a single component or module.

Each of Write Logic 210, Read Logic 212, and Data Return Logic 214 may comprise hardware logic, software logic, or a combination of both. As illustrated in the exemplary embodiment of FIG. 2, Write Logic 210 receives incoming write transactions for data to be written to memory device 130, such as from one or more of ASIL-D application 114a, 114b. Each write transaction may include an address of the memory device 130 to be written (an address within one of the provided ECC Regions 132a, 132b), a transaction size, and the data to be written to the memory device 130. Write Logic 210, either by itself or acting with other components such as Control Registers 216, translates this transaction information into a write command that may be communicated to the memory controller 120. The communication to the memory controller 120 may be direct if a "slave" side ECC Block 124, or via Fabric 116 if a "master" side ECC Block 114.

Similarly, Read Logic 212 receives an incoming read transaction for data to be retrieved from an ECC Region 132a, 132b of the memory device 130, such a read request from one or more of ASIL-D application 114a, 114b. Each read transaction may include an address of the memory device 130 from which data is to be read (written (an address within one of the provided ECC Regions 132a, 132b) and a transaction size. Read Logic 212 either by itself or acting with other components such as Control Registers 216, translates this transaction information into a read command for the memory device 130 that may be communicated to the memory controller 120. The communication to the memory controller 120 may be direct if a "slave" side ECC Block 124, or via Fabric 116 if a "master" side ECC Block 114.

Data Return Logic 214 receives the data read or retrieved from an ECC Region 132a, 132b of the memory device 130 (along with the ECC bits stored with the data). Data Return Logic 214 performs the error correction for the data and sends an ECC error message, such as an interrupt, in the event of ECC error. If no ECC error, Data Return Logic 214 provides the retrieved data to the original data requestor, such as one or more of ASIL-D application 114a, 114b. The communication to the data requestor may be direct if a "master" side ECC Block 114, or via Fabric 116 if a "slave" side ECC Block 124.

Figure 3A:
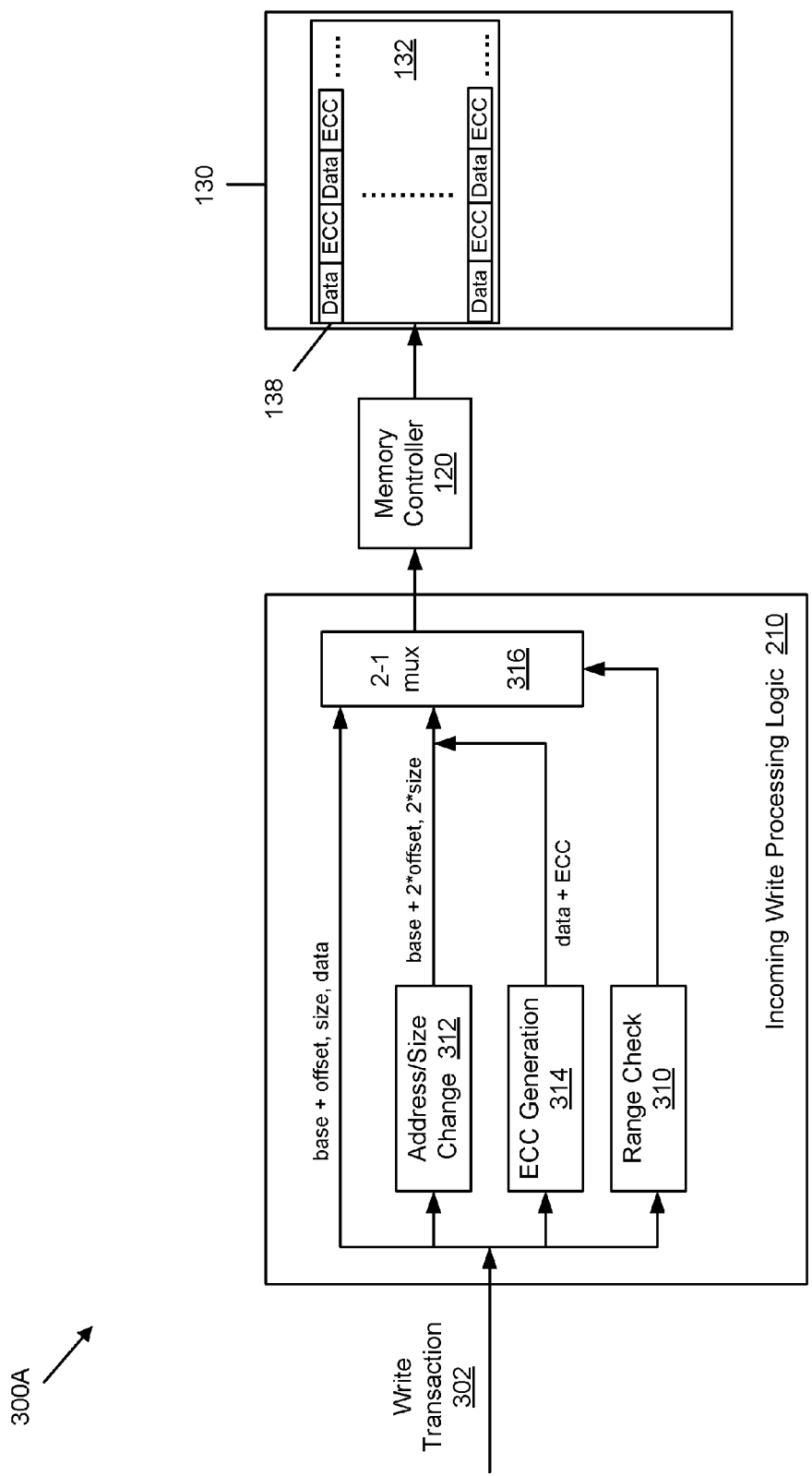
FIG. 3A is a functional diagram showing the interaction of portions of the systems of FIGS. 1-2 during a write transaction to the memory in communication with the SoC.

FIG. 3A is a functional diagram showing the interaction of portions of the systems of FIGS. 1-2 during a write transaction to the memory device 130. In particular, FIG. 3A illustrates an exemplary embodiment of Write Logic 210 of an ECC Block 144/124 illustrated in FIG. 2. As shown in FIG. 3A, Write Logic 210 is connected to and in communication with the memory controller 120, either directly or through Fabric 116. Memory controller 120 is in turn connected to and in communication with memory device 130. In the illustrated embodiment, there is a single memory device 130 with one ECC Region 132. In other embodiments, the system 300A may include multiple memory devices 130, with one or more of the memory devices 130 containing one or more ECC Regions 132.

The illustrated embodiment of the Write Logic 210 includes a Range Check module 310, an Address/Size Change module 312, an ECC Generation module 314, and a multiplexer ("mux") 316. In other implementations, the Write Logic 210 may contain more or fewer components or elements than those illustrated. In various embodiments, some or all of the modules, components or functions of the Write Logic 210 may be implemented in hardware, software, or firmware as desired.

In an embodiment, Write Logic 210 receives a write transaction 302 including include an address of the memory device 130 to be written (which may be an address within ECC Region 132), a transaction size, and the data to be written to the memory device 130. The address information may comprise a base value and an offset value to provide the range of addresses to which the data is to be written. In an embodiment, the write transaction 302 may be received from ASIL-D application 118a, 118b or ASIL-B application 119 (see FIG. 1).

Range check module 310 checks to see if the addresses to which the data will be written are part of ECC Region 132 of the memory device 130. This check may be made by range check module 310 acting by itself or acting with other components such as Control Registers 216. The output from the range check module 310 is input into the mux 316. In an embodiment this input into the mux 316 serves to turn the mux 316 "on" for the write transaction 302 where the addresses are in ECC Region 132. In such embodiments, where the addresses are not in ECC Region 132, the mux 316 is "off" and the received information from the write transaction 302 may be passed to memory controller 120 for writing to the non-ECC protected portions of memory device 130. Note that in some embodiments where a "master" side ECC Block 114 is implemented, range check module 310 may be optional for implementations where only the applications requiring ECC data protection are connected or in communication with the ECC Block 114.

Address/size change module 312 receives the address and transaction size information and doubles the transaction size, outputting an address range and transaction size twice as large as the ranges/values received in write transaction 302. In an embodiment, address/size change module 312 may output the same base value as received in the write transaction 302, but may double the offset and size values, doubling the size of the transaction. The output of the address/size change module 312 is provided to mux 316. Although illustrated as one component or module, address/size change module 312 may instead be implemented in other embodiments as separate logic, modules or components, with one module adjusting the addresses for the write transaction 302 and the other component adjusting the transaction size.

Note that as discussed below, the ECC bits are generated for, and appended to, each 1 Byte of data, which requires doubling the transaction size/write in the memory device 130. In other embodiments where ECC bits are generated for, and appended to, larger granularities of the data (such as 1 Bytes, 4 Bytes, etc.), the address/size change module 312 will not double the transaction size. Instead, for such embodiments address/size change module 312 will increase the transaction size to the size necessary to store the ECC bits with the larger data granularity.

The ECC generation module 314 generates ECC bits or information for the data received in the write transaction 302 and outputs the data plus ECC bits to the mux 316. Mux 316 may then combine the combined data and ECC bits with the output from address/size change module 312 when mux 316 has been turned "on" by range check 310. In the embodiment illustrated in FIG. 3A, the ECC bits are generated for each 1 Byte of date received in the write transaction 302 and appended to each 1 Byte of data. In this manner the ECC bits become interleaved with each 1 Byte of data in the write transaction 302, effectively doubling the size of the data to be written to the ECC Regions 132 of the memory device 130 in the illustrated embodiment.

As will be understood, the ECC generation module 314 may in other embodiments generate ECC bits or information for larger granularities of data, such as for each 2 Byte, 4 Byte, etc. block of data. However, it is desirable that the ECC bits or information are available for the smallest granularity of data that may be subsequently read from the memory device 130. Thus, for example, if the smallest read/write access granularity is 2 bytes, only 8 ECC bits are needed or generated to protect both bytes. ECC generation module 314 may also generate ECC bits according to any desired ECC method. For example, in various embodiments the ECC generation module 314 may implement single error correction-double error detection (SEC-DED), double error correction-triple error detection (DEC-TED), etc.

The mux 316 outputs to memory device 130, either directly, or via the memory controller 120 and/or Fabric 116. In the event of a write transaction for ECC region 132, the size/addresses for the write transaction are doubled by the Write Logic 210, and the interleaved data and ECC bits 138 created by the Write Logic 210 are written to the doubled address range of ECC Region 132. In the event of a write transaction 302 to a non-ECC protected portion of memory device 130, the data of the write transaction 302 is simply written to the non-ECC protected portions at the address range of the write transaction 302.

Figure 3B:
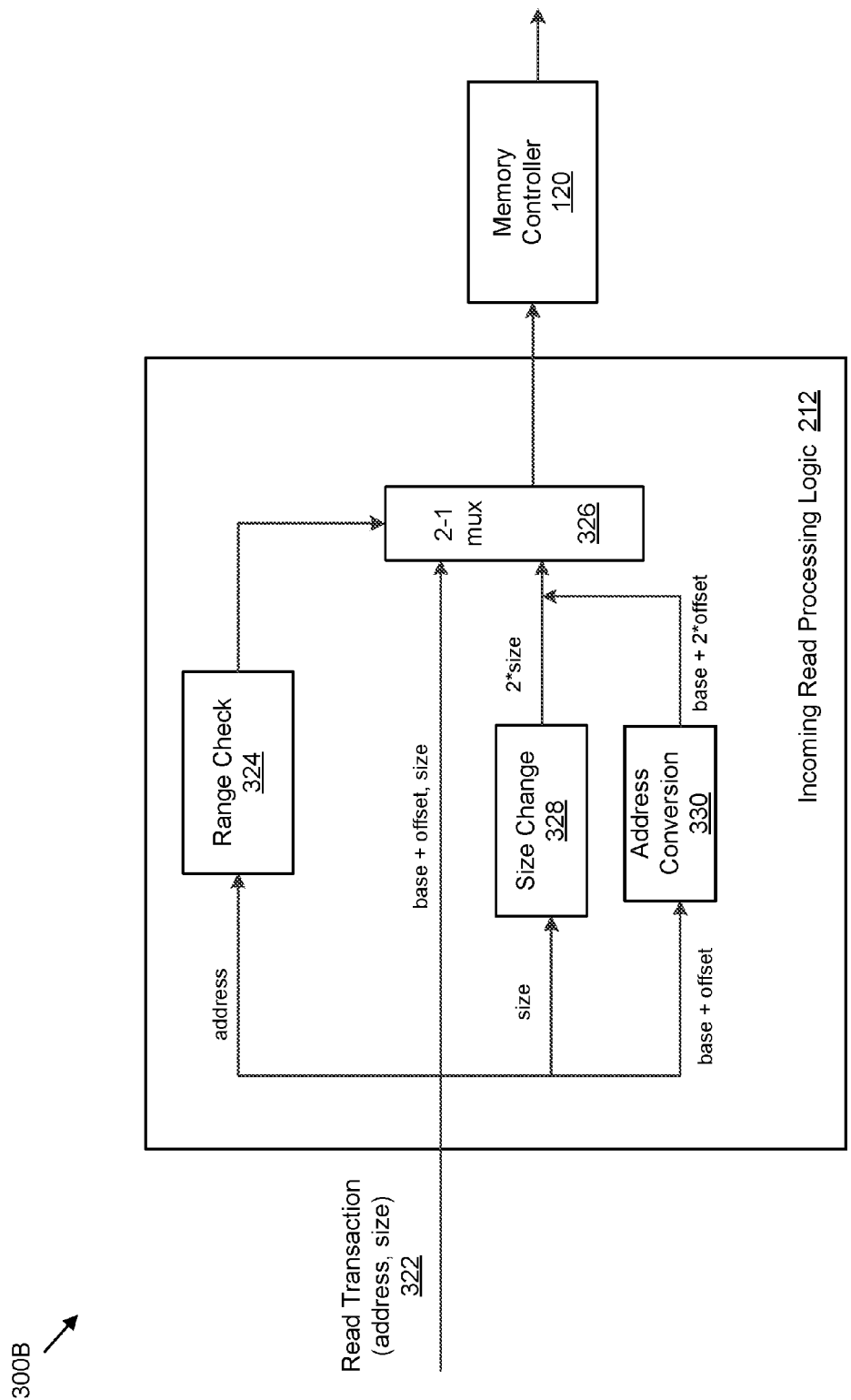
FIG. 3B is a functional diagram showing the interaction of portions of the systems of FIGS. 1-2 during a read transaction from the memory in communication with the SoC.

FIG. 3B is a functional diagram showing the interaction of portions of the systems of FIGS. 1-2 during a read transaction of data from a memory device 130. In particular, FIG. 3B illustrates an exemplary embodiment of Read Logic 212 of an ECC Block 144/124 illustrated in FIG. 2. As shown in FIG. 3B, Read Logic 212 is connected to and in communication with the memory controller 120, either directly or through Fabric 116. Memory controller 120 is in turn connected to and in communication with one or more memory device 130 (not illustrated), such as memory device 130 shown in FIG. 3A.

The illustrated embodiment of the Read Logic 212 includes a range check module or logic 324, a size change module or logic 328, an address conversion module or logic 330, and a multiplexer ("mux") 326. In other implementations, the Read Logic 212 may contain more or fewer components or elements than those illustrated. In various embodiments, some or all of the modules, components or functions of the Read Logic 212 may be implemented in hardware, software, or firmware as desired.

In an embodiment, Read Logic 210 receives a read transaction 322 including include an address of the memory device 130 from which to retrieve data (which may be an address within ECC Region 132), and a read transaction size. The address information may comprise a base value and an offset value to provide the range of addresses from which the data is to be read.

Range check module 324 may operate similarly to range check module 310 of FIG. 3A, and may in some embodiments be the same component or module. Range check module 324 checks to see if the addresses from which the data will be read are part of an ECC Region 132 of a memory device 130, such as memory device 130 of FIG. 3A. This check be made by range check module 324 acting by itself or acting with other components such as Control Registers 216. The output from the range check module 324 is input into the mux 326. In an embodiment this input into the mux 326 serves to turn the mux 326 "on" for the read transaction 322 where the addresses are in ECC Region 132. In such embodiments, where the addresses are not in ECC Region 132, the mux 326 is "off" and the read transaction 322 may be passed to memory controller 120 for reading data from non-ECC protected portions of memory device 130. Note that in some embodiments where a "master" side ECC Block 114 is implemented, range check module 324 may be optional for implementations where only the applications requiring ECC data protection are connected or in communication with the ECC Block 114.

Size change module 328 and address conversion module 330 operate similarly to address/size change module 312 of FIG. 3A; although in FIG. 3B they are separate modules 328, 330. Size change module 328 receives the transaction size information from the read transaction 322 and doubles the transaction size, outputting increased transaction size to mux 326. Address conversion module 330 receives the address range from the read transaction 322 and doubles the size of the address range. In an embodiment, address conversion module 330 may output the same base value as received in the read transaction 322, but may double the offset value, thereby doubling the address ranges for the transaction. The output of the address conversion module 330 is also provided to mux 326. Although illustrated as separate components or modules, size change module 328 and address conversion module 330 may instead be implemented in other embodiments as a single logic, module or component.

The mux 326 outputs to memory device 130, either directly, or via the memory controller 120 and/or Fabric 116. In the event of a write transaction for ECC region 132, the size and addresses for the write transaction are doubled by the Read Logic 212, and the interleaved data and ECC bits 138 stored at this doubled address range are read from the ECC Region 132. In the event of a read transaction 322 from to a non-ECC protected portion of memory device 130, the data is simply read from the non-ECC protected portions at the address range of the read transaction 322.

Figure 3C:
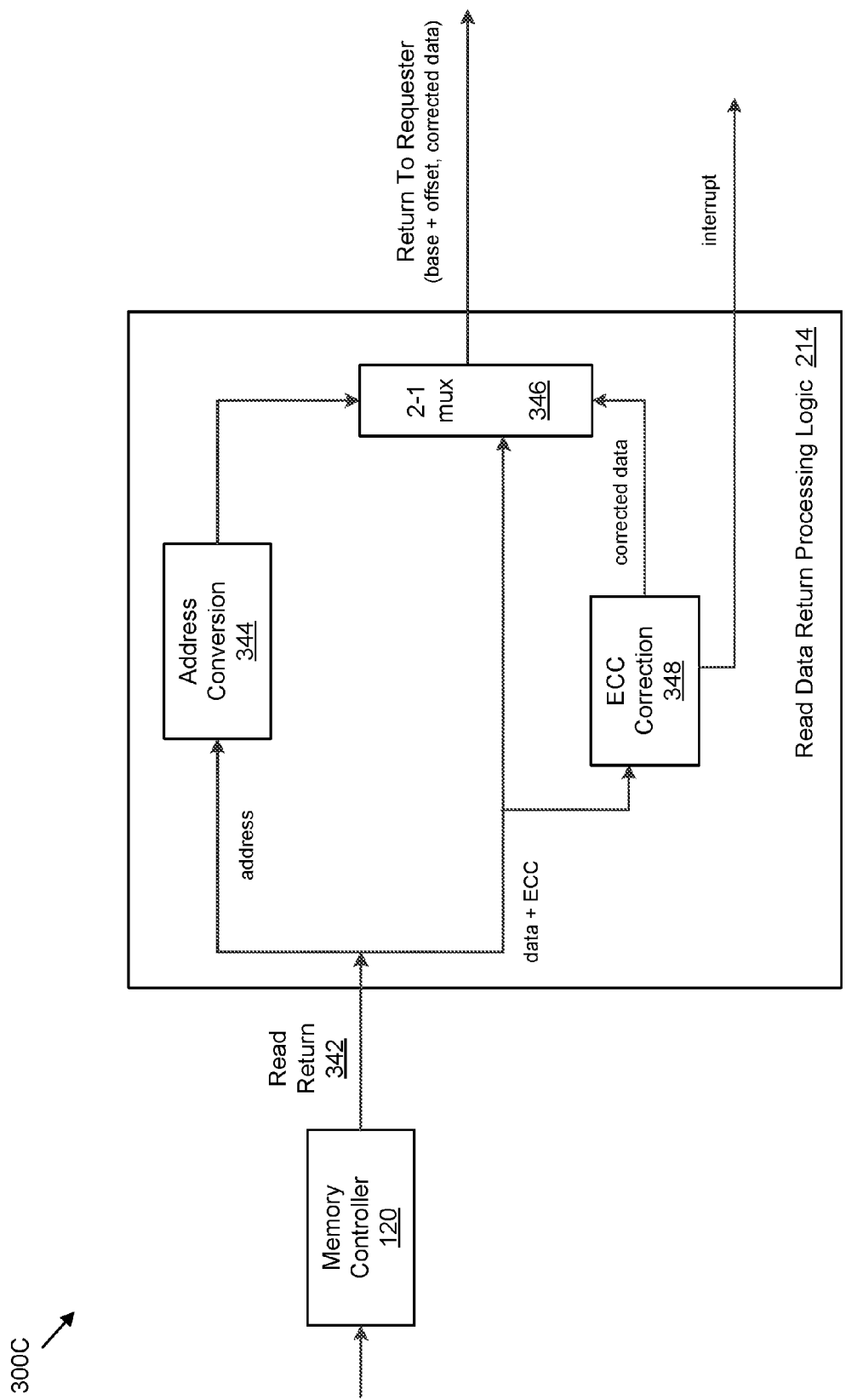
FIG. 3C is a functional diagram showing the interaction of portions of the systems of FIGS. 1-2 during the data return from the memory for the read transaction.

FIG. 3C is a functional diagram showing the interaction of portions of the systems of FIGS. 1-2 during a read transaction of data from a memory device 130. In particular, FIG. 3C illustrates an exemplary embodiment of Data Return Logic 214 of an ECC Block 144/124 illustrated in FIG. 2. As shown in FIG. 3C, Data Return Logic 214 is connected to and in communication with the memory controller 120, either directly or through Fabric 116. Memory controller 120 is in turn connected to and in communication with one or more memory device 130 (not illustrated), such as memory device 130 shown in FIG. 3A.

The illustrated embodiment of the Data Return Logic 214 includes an address conversion module 344, an ECC correction module 348, and a multiplexer ("mux") 346. In other implementations, the Data Return Logic 214 may contain more or fewer components or elements than those illustrated. In various embodiments, some or all of the modules, components or functions of the Data Return Logic 214 may be implemented in hardware, software, or firmware as desired.

In an embodiment, Data Return Logic 214 receives a read return 342 from the memory device including include an address of the memory device 130 from which the data was retrieved (which may be an address range within ECC Region 132), a transaction size, and the interleaved data and ECC bits (see 138 FIG. 3A) retrieved from the memory device 130. The address information may comprise a base value and an offset value to provide the range of addresses from which the data and ECC bits were retrieved.

Address conversion module 344 receives the address information and may in some embodiments determine whether or not the received address is associated with and/or allocated to an ECC protected portion of the memory device, such as one or ECC Regions 132a, 132b of FIG. 1. This determination may be made by address conversion module 344 acting by itself or acting with other components such as Control Registers 216. If the received address is not from an ECC protected portion of the memory device 130, address conversion module 344 may do nothing, or may just pass the received address from the read return 342.

If the received address is from an ECC protected portion, such as ECC Region 132a, 132b, address conversion module 344 halves the address range, outputting an address range half as large as the ranges/values received in read return 342 in the illustrated embodiment. In an embodiment, address conversion module 344 may output the same base value as received in the read return 342, but may divide the offset value in two, halving the size of the address range. The output of the address conversion module 344 is provided to mux 346.

Note that as discussed above, in the illustrated embodiment the ECC bits were generated for, and appended to, each 1 Byte of data, which requires halving the addresses after the ECC bits have been removed from the data. In other embodiments where ECC bits are generated for, and appended to, larger granularities of the data (such as 1 Bytes, 4 Bytes, etc.), the address conversion module 344 will not halve the size of the address range. Instead, for such embodiments address conversion module 344 will reduce the address range by the size necessary to reflect the removal of the ECC bits from the larger data granularity.

ECC correction module 348 performs error correction on the received data using the interleaved ECC bits, and outputs the corrected data (minus the ECC bits or information) to the mux 346. Mux 316 may then combine the data with the output from address conversion module 344. ECC correction module 348 may perform error correction according to any desired ECC method. For example, in various embodiments the ECC correction module 348 may implement single error correction-double error detection (SEC-DED), double error correction-triple error detection (DEC-TED), etc. In the event of an error (whether uncorrectable or correctable), ECC correction module 348 sends an error correct indicator or interrupt to notify the SoC 102 of the error (whether uncorrectable or correctable). Such error correct indicator or interrupt may in an embodiment be sent to an interrupt handler for CPU 106 of FIG. 1.

The mux 346 outputs the retrieved data (minus the ECC bits or information) back to the requestor, along with the original address to data requestor, such as ASIL-D application 118a, 118b. Mux 346 may send the retrieved data either directly, or via the Fabric 116 in various embodiments.

Figure 4:
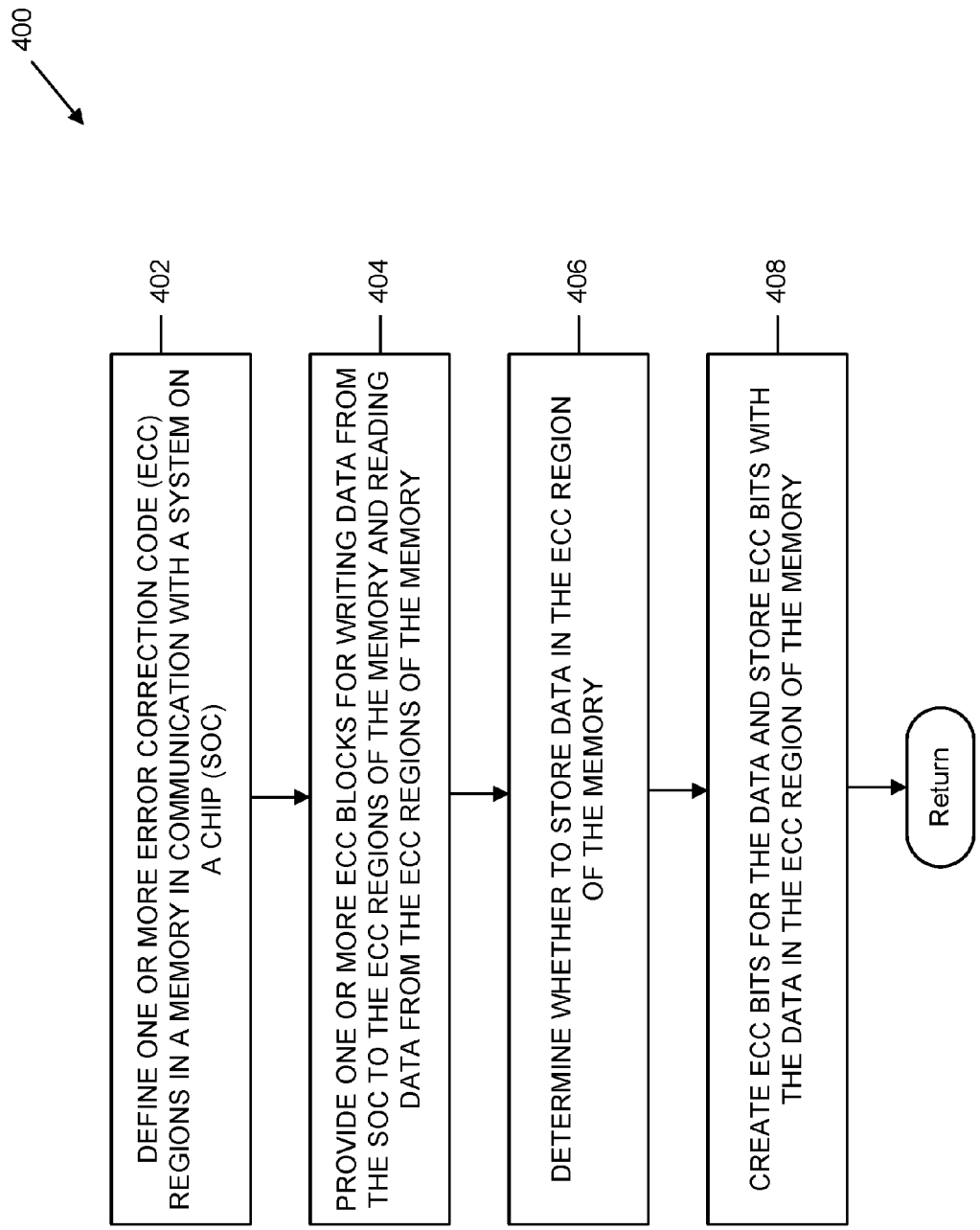
FIG. 4 is a flowchart illustrating an embodiment of a method for implementing ECC regions in a memory in communication with an SoC.

Turning to FIG. 4, a flowchart of an embodiment of a method 400 for implementing ECC regions for a memory in communication with an SoC is illustrated. In an embodiment, the method 400 may be implemented by a system such as system 100 of FIG. 1 and/or system 200 of FIG. 2. In block 402, one or more ECC regions are defined or provided in a memory in communication with the SoC. In an embodiment, the memory may be a memory device 130 like that illustrated in FIG. 1 with ECC regions 132a, 132b. Memory device 130 may in an embodiment be a DDR device or a LPDDR device.

The ECC regions 132a, 132b may be provided or defined in block 402 by mapping the ECC regions 132a, 132b in a memory map stored in the memory 112 of SoC 102. Such mapping may be static, e.g. performed once during start-up of the SoC 102 such that the ECC regions 132a, 132b, etc. are defined for each memory device 130 during operation of the SoC 102. In other embodiments, the mapping may be dynamic or periodically performed, such as at a change of state of the SoC 102 and/or when one or more application requiring ECC protected data becomes active or is executing on the SoC 102. Such applications may include ASIL-D application 118a, 118b illustrated in FIG. 1.

In block 404 one or more ECC blocks are provided. In an embodiment the ECC blocks may comprise one or more "master" ECC Blocks 114 and/or one or more "slave" ECC Blocks 124 illustrated in FIG. 1. As discussed above, the ECC Blocks 114 and/or 124 may be configured to allow writing ECC protected data to, and reading ECC protected data from, one or more ECC Region 132 of the memory device 130.

In block 406, a determination may be made for a write transaction whether or not to write the data to one or more ECC Region 132 of the memory device 130. Such determination may be made in an embodiment based in part on one or more of an address or address range of the write transaction or the application sending the write transaction. For example, in an embodiment a write transaction from an ASIL-D application 118a (see FIG. 1) may cause a determination that the date will be ECC protected by writing to an ECC Region 132 of the memory device 130.

ECC bits are then generated or created for the data of the write transaction in block 408. In an embodiment ECC bits are computed or generated for each 1 Byte block of data as mentioned in block 408. In other embodiments ECC bits may be generated for other granularities of data, such as 2 Byte blocks, 4 Byte blocks, etc. The ECC bits are stored with the data in the ECC Region 132 of the memory device 130, without the need to provide an entire memory device 130 that is ECC protected.

Figure 5A:
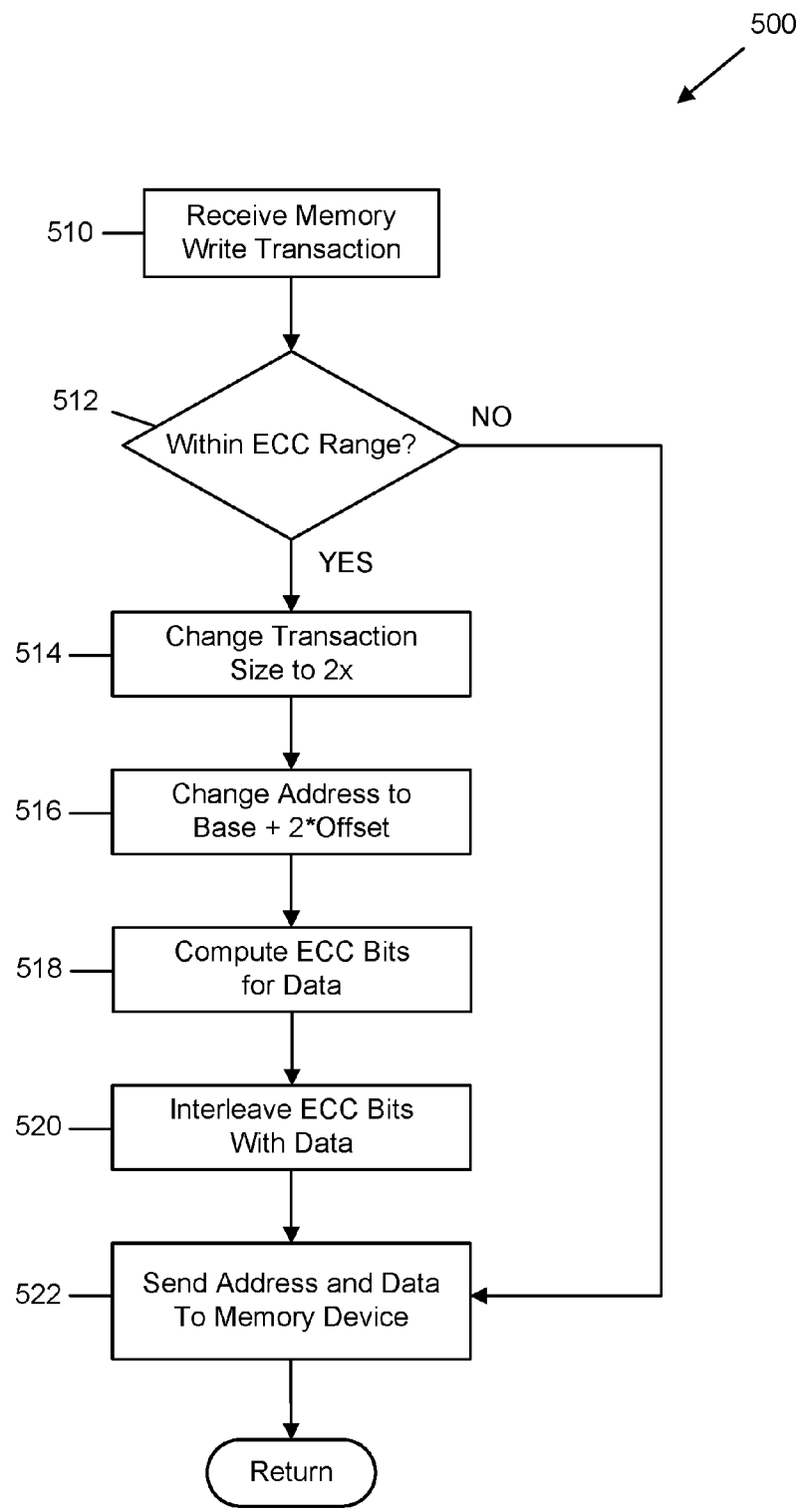
FIG. 5A is a flowchart illustrating an embodiment of a method for providing ECC bits with the data for a write transaction to the ECC region of the memory in communication with the SoC.

FIG. 5A is a flowchart illustrating an embodiment of a method 500A for storing ECC bits with the data for a write transaction. The method 500A may in an embodiment be performed by Write Logic 210 like that illustrated in FIG. 3A. Method 500A begins in block 510 with the receipt of a memory write transaction, such as write transaction 302 of FIG. 3A. The write transaction may be generated by and/or received from one or more application executing on the SoC 102, such as ASIL-D applications 118a, 118b or ASIL-B application 119 shown in FIG. 1.

In block 512 a determination is made whether the address of the memory write transaction is for an ECC protected memory range. This determination in block 512 may be made in some embodiments based in whole or in part on the component or application from which the memory write transaction was received in block 510. In other embodiments, the determination of block 512 may be based in whole or in part on whether the address of the memory write transaction is mapped to an ECC protected portion of a memory, such as ECC Region 132a, 132b of memory device 130 (FIG. 1). In an implementation, the determination of block 512 may be made by the range check module 310 of Write Logic 210 illustrated in FIG. 3A.

If the determination in block 512 is that the write transaction is not for an ECC protected memory portion, method 500A continues to block 522. In this iteration of block 522 the unmodified address and data of the write transaction are sent to the specified memory location. In an embodiment, this operation of block 522 may comprise sending the write transaction to a memory controller 120 to write the data to a non-ECC protected portion of memory device 130 (FIG. 1).

If the determination in block 512 is that the write transaction is for an ECC protected memory portion, method 500A continues to block 514. In block 514 a transaction size of the write transaction is increased. In the illustrated embodiment, the transaction size is doubled. In other embodiments as discussed above, the transaction size may be increased by a smaller amount. Method 500A continues to block 516 where the address range is also increased. In an embodiment the address range is also doubled in block 516, which may be accomplished in any desired method. For the illustrated implementation, the address range is doubled by keeping the same base of the write transaction address, but multiplying the offset of the write transaction address by 2. Note that blocks 514 and 516 may be performed by separate components, modules, or logic in some embodiments, or may be performed by a single component, module or logic such as address/size change module 312 of FIG. 3A.

In block 518 ECC bits are computed or generated for the data of the write transaction. In an embodiment ECC bits are computed generated for each 1 Byte block of data as mentioned in block 518. In other embodiments ECC bits may be generated for other granularities of data, such as 2 Byte blocks, 4 Byte blocks, etc. The generated or created ECC bits are then appended to their respective data blocks, interleaving the ECC bits and data blocks in block 520. Blocks 518 and 520 may be performed by separate components, modules, or logic in some embodiments, or may be performed by a single component, module or logic such as ECC generation module 314 of FIG. 3A.

Method 500A continues to block 522 where the modified write transaction is sent to the memory device 130 either directly or via memory controller 120 and/or Fabric 116 (see FIG. 1). In this iteration of block 522, the interleaved data and ECC bits are forwarded to the address (the address having been doubled in size) of the ECC Region 132 of memory device 130.

In this manner, ECC protection may be provided for a portion of the memory device 130, without the need to ECC protect the entire memory device 130. In some embodiments, more than one portion or region of the memory device 130 may be ECC protected (ECC Regions 132a, 132b of FIG. 1). Additionally, in various embodiments, the ECC protected portions or regions may vary in size, ranging from 512 KB to 32 MB as desired. Method 500A then returns.

Figure 5B:
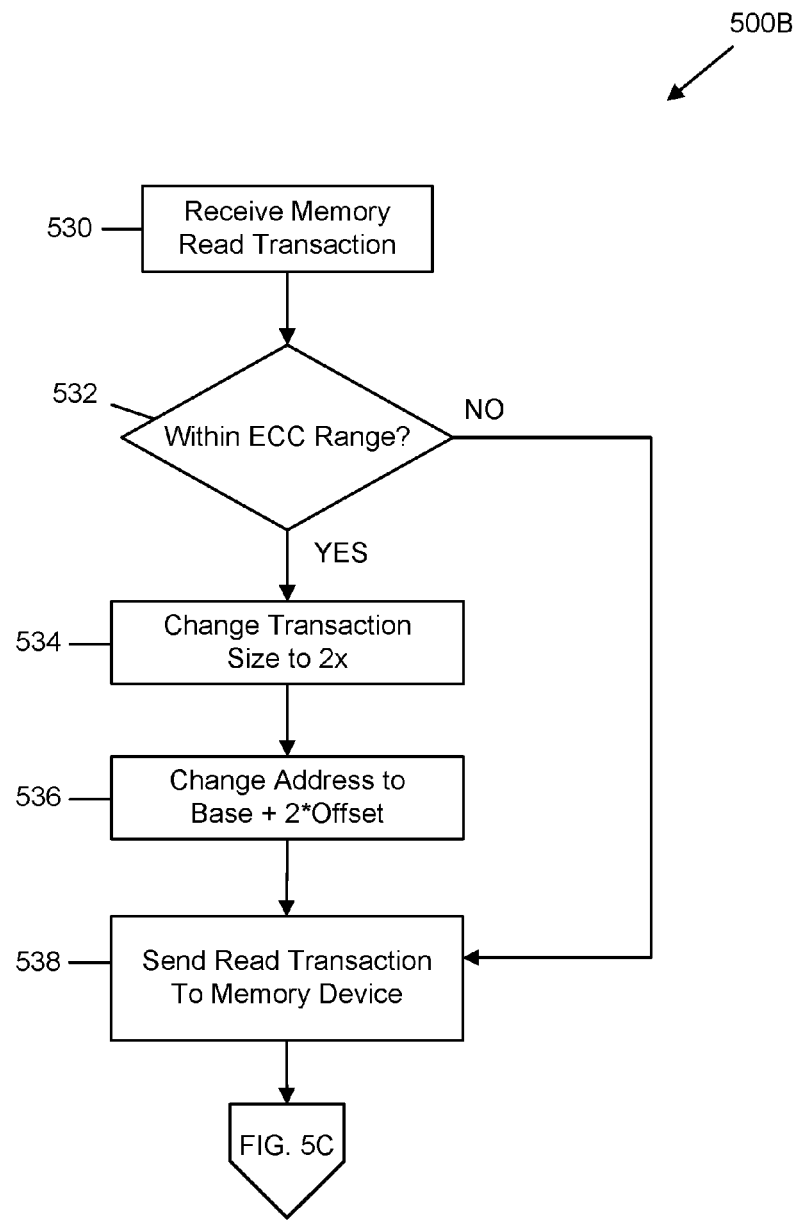
FIG. 5B is a flowchart illustrating an embodiment of a method for retrieving ECC bits with the data for a read transaction from the ECC region of the memory in communication with the SoC.

FIG. 5B is a flowchart illustrating an embodiment of a method 500B for processing a read transaction, such as a read request from one or more memory client of SOC 102 for data stored on one or more memory device 130 (see FIG. 1). Method 500B may in an embodiment be performed by Read Logic 212 like that illustrated in FIG. 3B. In block 530, a memory read transaction, such as read transaction 322 of FIG. 3B, is received. The read transaction may be generated by and/or received from one or more application executing on the SoC 102, such as ASIL-D applications 118a, 118b or ASIL-B application 119 shown in FIG. 1.

Method 500B continues to block 532 where a determination is made whether the address of the memory read transaction is for data stored in an ECC protected memory range. This determination in block 532 may be made in some embodiments based in whole or in part on the component or application from which the memory read transaction was received in block 530. In other embodiments, the determination of block 532 may be based in whole or in part on whether the address of the memory read transaction is mapped to an ECC protected portion of a memory, such as ECC Region 132a, 132b of memory device 130 (FIG. 1). In an implementation, the determination of block 532 may be made by the range check module 324 of Read Logic 212 illustrated in FIG. 3B.

If the determination in block 532 is that the write transaction is not for an ECC protected memory portion, method 500B continues to block 538. In this iteration of block 538 the unmodified address for the received read transaction is used to retrieve the requested data. In an embodiment, this operation of block 538 may comprise sending the read transaction to memory controller 120 to read the data from a non-ECC protected portion of memory device 130 (FIG. 1).

If the determination in block 532 is that the read transaction is for an ECC protected memory portion, method 500B continues to block 534. In block 534 a transaction size of the write transaction is increased. In the illustrated embodiment, the transaction size is doubled. In other embodiments as discussed above, the transaction size may be increased by a smaller amount.

Method 500B continues to block 536 where the address range for the read transaction is also increased. In an embodiment the address range is also doubled in block 536, which may be accomplished in any desired method. For the illustrated implementation, the address range is doubled by keeping the same base of the read transaction address, but multiplying the offset of the read transaction address by 2. Note that blocks 534 and 536 may be performed by separate components, modules, or logic in some embodiments such as size change module 328 and address conversion module 330 of FIG. 3B. In other embodiments blocks 534 and 536 may instead be performed by a single component, module or logic.

Method 500B continues to block 538 where the read transaction is sent to the memory device 130 either directly or via memory controller 120 and/or Fabric 116 (see FIG. 1). In this iteration of block 538, the modified address and transaction size (both doubled in size) are forwarded to the memory device 130 or to the memory controller 120 to execute the read transaction from the memory device 130. Regardless of the path, the modified read transaction allows both the requested data and the ECC bits associated and stored with the data in ECC Region 132 of memory device 130 to be read.

In some embodiments, more than one portion or region of the memory device 130 may be ECC protected, such as ECC Regions 132a, 132b of FIG. 1, and read requests may be directed from various memory clients to one or more of the ECC Regions 132a, 132b. Thus, multiple memory clients, such as ASIL-D applications 118a, 118b may send read transactions for data from the same ECC Region 132a for example. Similarly, a single memory client, such as ASIL-D application 118a may send read transactions for data from multiple ECC Regions 132a, 132b. As noted, in various embodiments, the ECC protected portions or regions may vary in size, ranging from 512 KB to 32 MB as desired. Method 500B then ends, and may in an embodiment go to FIG. 5C after the requested data is retrieved from the memory device 130.

Figure 5C:
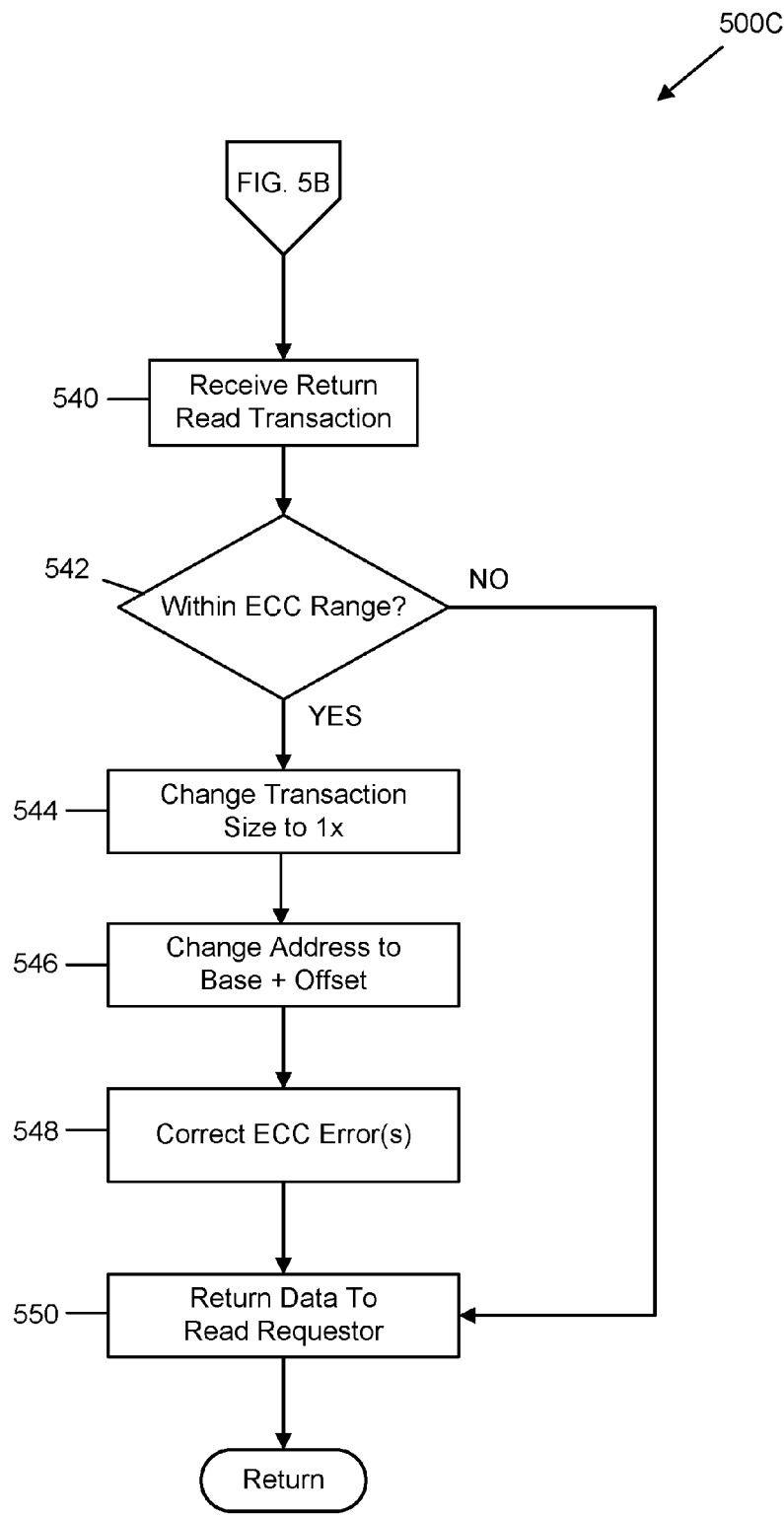
FIG. 5C is a flowchart illustrating an embodiment of a method for returning the retrieved data to the read requestor.

FIG. 5C illustrates an embodiment of a method 500C for returning the retrieved data from the memory device 130 to the requesting memory client. Method 500C may in an embodiment be performed by Data Return Logic 214 like that illustrated in FIG. 3C. In an embodiment, method 500C may be a separate method from the method 500B of FIG. 5B; while in other embodiments method 500C may be a continuation of method 500B. Method 500C begins in block 540 with the receipt of a return read transaction, such as read return 342 from memory device 130 as illustrated in FIG. 3C. The return read transaction may be received directly from memory device 130 or received via memory controller 120 and/or Fabric 116 (see FIG. 1).

In block 542 a determination is made whether the address of the memory write transaction is for an ECC protected memory range. This determination in block 542 may be made in some embodiments based in whole or in part on whether the address of the return read transaction is associated with or mapped to an ECC protected portion of a memory, such as ECC Region 132a, 132b of memory device 130 (FIG. 1). In an implementation, the determination of block 542 may be made by address conversion module 344 of Data Return Logic 214 illustrated in FIG. 3C.

If the determination in block 542 is that the return read transaction is not from an ECC protected memory portion, method 500C continues to block 550. In this iteration of block 550 the unmodified data of the return read transaction is returned to the requesting memory client, such as ASIL-B application 119 of FIG. 1. In an embodiment, this operation of block 550 may comprise sending the retrieved data to the requesting memory client via Fabric 116 (see FIG. 1).

If the determination in block 542 is that the return read transaction is from an ECC protected memory portion, method 500C continues to block 544. In block 544 a transaction size of the write transaction is increased. In the illustrated embodiment, the transaction size is halved. In other embodiments as discussed above, the transaction size may be increased by a smaller amount. Method 500C continues to block 546 where the address range is also decreased. In an embodiment the address range is also halved in block 546, which may be accomplished in any desired method.

For the illustrated implementation, the address range is halved by keeping the same base of the return read transaction address, but dividing the offset of the return read transaction address by 2. Note that blocks 544 and 546 may be performed by separate components, modules, or logic in some embodiments, or may be performed by a single component, module or logic such as address conversion module 344 of FIG. 3C.

In blocks 548-549 ECC error correction is performed for the data of the return read transaction. In the embodiment of FIG. 5C, the error correction is illustrated as a first determination in block 548 whether a single-bit ECC error has occurred for any of the data bytes. If no single-bit ECC errors are found, a second determination is made in block 549 whether a double-bit DCC error has occurred for any of the data bytes. Note that in other embodiments, the ECC error correction may not comprise separate determinations as illustrated.

In an embodiment ECC bits have been previously generated for each 1 Byte block of data and stored interleaved with the data. In other embodiments ECC bits may be generated for other granularities of data, such as 2 Byte blocks, 4 Byte blocks, etc. Regardless of the data block granularity, the previously generated ECC bits are extracted from their respective data blocks, in blocks 548-549 and the ECC bits are used to perform error correction on the data using any desired method.

In various embodiments the ECC error correction may comprise implement single error correction-double error detection (SEC-DED), double error correction-triple error detection (DEC-TED), etc. In the event of a correctable single-bit error being detected for any data byte in FIG. 548, the ECC error(s) are corrected in block 552 and an indicator or interrupt indicating the single-bit error is sent in block 554, such as to an interrupt handler for CPU 106 of FIG. 1. Method 500C also continues from block 552 to block 550 where the data is returned to the requesting memory client. If no ECC errors are found in blocks 548 or 549, or if the data errors are correctable in block 552, the data from the return read transaction, minus the ECC bits, is returned to the requesting memory client block 550. Such memory clients may include ASIL-D applications 118a, 118b of FIG. 1. In an embodiment, this operation of block 550 may comprise sending the retrieved data to the requesting memory client via Fabric 116 (see FIG. 1). Method 500C then returns.

Returning to FIG. 5, in the event that an uncorrectable double-bit error is determined, and an indicator or interrupt indicating the double-bit/uncorrectable error is sent in block 554, such as to an interrupt handler for CPU 106 of FIG. 1. Note that if an uncorrectable error is determined in block 549, such that the data errors may not be corrected, the method 500C skips block 550 after the indicator or interrupt is sent in block 554—i.e. no data is returned. Method 500C then returns.

As will be understood, whether an error may be determined uncorrectable in block 548-549 depends on the implementation. For example, in embodiments of the method 500C and/or system 300C of FIG. 3C implementing single error correction-double error detection (SEC-DED), a double-bit error would be an uncorrectable error. For embodiments implementing double error correction-triple error detection (DEC-TED), a triple bit error would be an uncorrectable error. The actions of block 548-549 may in an embodiment be performed by a single component, module or logic in an embodiment, such as ECC correction module 348 of FIG. 3C.

Figure 6:
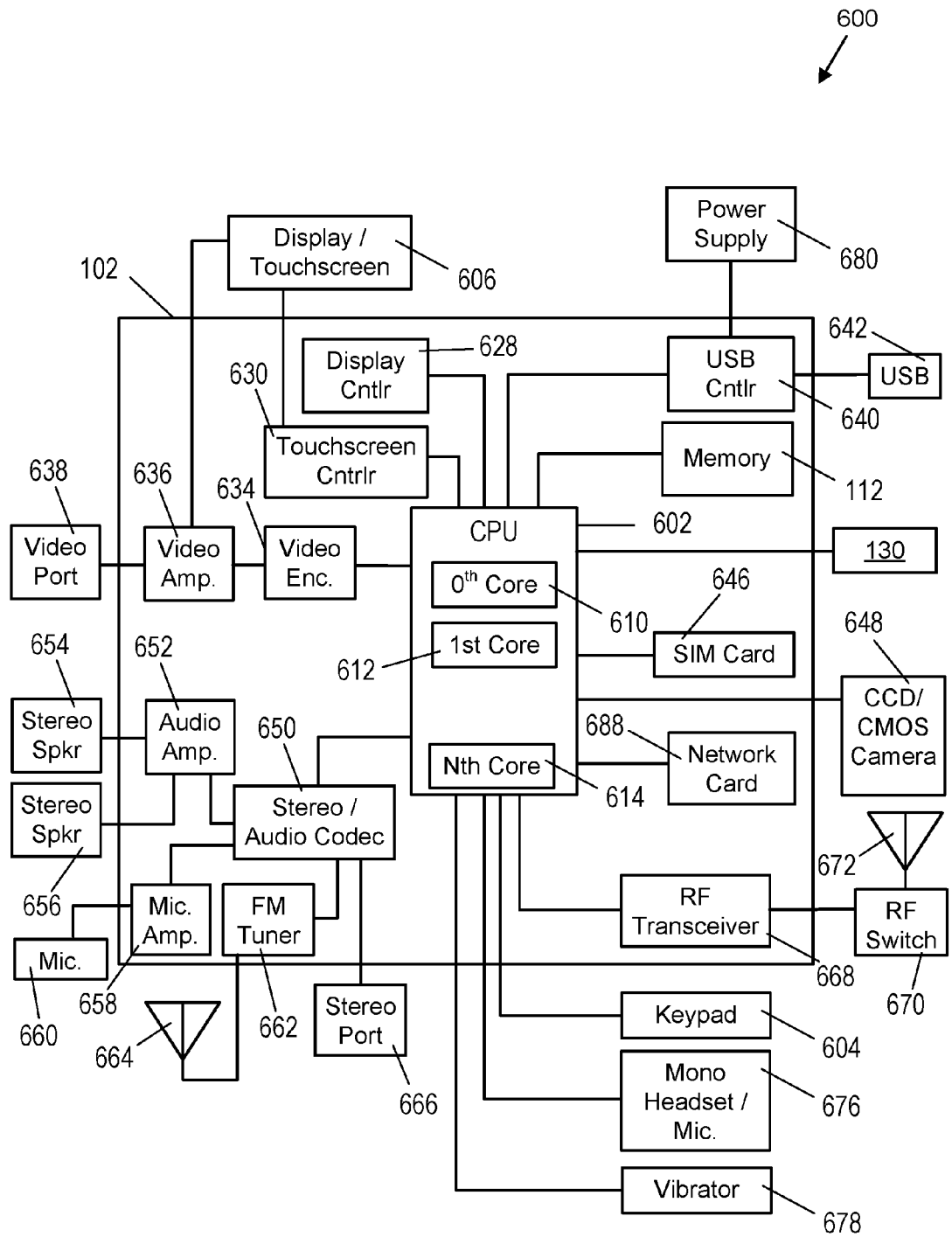
FIG. 6 is a block diagram of an exemplary computing device in which the systems of FIGS. 1-2 and 3A-3C, or methods of FIGS. 4 and 5A-5C may be implemented.

Systems 100 (FIG. 1), 200 (FIG. 2), and 300A-300C (FIGS. 3A-3C), was well as methods 400 (FIG. 4) and/or 500A-500C (FIGS. 5A-5C) may be particularly suited for automotive applications subject to the requirements of ISO 26262 and/or ASIL-A through ASIL-D. However, the above systems and methods may be incorporated into or performed by any desired computing system. FIG. 6 illustrates the system 100 incorporated in an exemplary portable computing device (PCD) 600. In this embodiment, the SoC 102 may include a multicore CPU 602. The multicore CPU 602 may include a zeroth core 610, a first core 612, and an Nth core 614. One of the cores may comprise, for example, a graphics processing unit (GPU) with one or more of the others comprising the CPU.

A display controller 628 and a touch screen controller 630 may be coupled to the CPU 602. In turn, the touch screen display 606 external to the on-chip system 102 may be coupled to the display controller 628 and the touch screen controller 630. FIG. 6 further shows that a video encoder 634, e.g., a phase alternating line (PAL) encoder, a sequential color a memoire (SECAM) encoder, or a national television system(s) committee (NTSC) encoder, is coupled to the multicore CPU 602. Further, a video amplifier 636 is coupled to the video encoder 634 and the touch screen display 606.

Also, a video port 638 is coupled to the video amplifier 636. As shown in FIG. 6, a universal serial bus (USB) controller 640 is coupled to the multicore CPU 602. Also, a USB port 642 is coupled to the USB controller 640. Memory 112 and a subscriber identity module (SIM) card 646 may also be coupled to the multicore CPU 602.

Further, as shown in FIG. 6, a digital camera 648 may be coupled to the multicore CPU 602. In an exemplary aspect, the digital camera 648 is a charge-coupled device (CCD) camera or a complementary metal-oxide semiconductor (CMOS) camera.

As further illustrated in FIG. 6, a stereo audio coder-decoder (CODEC) 650 may be coupled to the multicore CPU 602. Moreover, an audio amplifier 652 may be coupled to the stereo audio CODEC 650. In an exemplary aspect, a first stereo speaker 654 and a second stereo speaker 656 are coupled to the audio amplifier 652. FIG. 6 shows that a microphone amplifier 658 may be also coupled to the stereo audio CODEC 650. Additionally, a microphone 660 may be coupled to the microphone amplifier 658. In a particular aspect, a frequency modulation (FM) radio tuner 662 may be coupled to the stereo audio CODEC 650. Also, an FM antenna 664 is coupled to the FM radio tuner 662. Further, stereo headphones 666 may be coupled to the stereo audio CODEC 650.

FIG. 6 further illustrates that a radio frequency (RF) transceiver 668 may be coupled to the multicore CPU 602. An RF switch 670 may be coupled to the RF transceiver 668 and an RF antenna 672. A keypad 604 may be coupled to the multicore CPU 602. Also, a mono headset with a microphone 676 may be coupled to the multicore CPU 602. Further, a vibrator device 678 may be coupled to the multicore CPU 602.

FIG. 6 also shows that a power supply 680 may be coupled to the on-chip system 102. In a particular aspect, the power supply 680 is a direct current (DC) power supply that provides power to the various components of the PCD 600 that require power. Further, in a particular aspect, the power supply is a rechargeable DC battery or a DC power supply that is derived from an alternating current (AC) to DC transformer that is connected to an AC power source.

FIG. 6 further indicates that the PCD 600 may also include a network card 688 that may be used to access a data network, e.g., a local area network, a personal area network, or any other network. The network card 688 may be a Bluetooth network card, a WiFi network card, a personal area network (PAN) card, a personal area network ultra-low-power technology (PeANUT) network card, a television/cable/satellite tuner, or any other network card well known in the art. Further, the network card 688 may be incorporated into a chip, i.e., the network card 688 may be a full solution in a chip, and may not be a separate network card 688.

Referring to FIG. 6, it should be appreciated that the memory 130, touch screen display 606, the video port 638, the USB port 642, the camera 648, the first stereo speaker 654, the second stereo speaker 656, the microphone 660, the FM antenna 664, the stereo headphones 666, the RF switch 670, the RF antenna 672, the keypad 674, the mono headset 676, the vibrator 678, and the power supply 680 may be external to the on-chip system 102 or "off chip."

It should be appreciated that one or more of the method steps described herein may be stored in the memory as computer program instructions. These instructions may be executed by any suitable processor in combination or in concert with the corresponding module to perform the methods described herein. Certain steps in the processes or process flows described in this specification naturally precede others for the invention to function as described. However, the invention is not limited to the order of the steps or blocks described if such order or sequence does not alter the functionality of the invention.

That is, it is recognized that some steps or blocks may performed before, after, or parallel (substantially simultaneously with) other steps or blocks without departing from the scope and spirit of the invention. In some instances, certain steps or blocks may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for implementing error correction control (ECC), the method comprising:
    defining, in a single memory device, one or more ECC regions and one or more non-ECC regions, the memory device coupled to a system on a chip (SoC);
    providing an ECC block on the SoC, the ECC block in communication with the one or more ECC regions in the memory device;
    receiving at a write logic of the ECC block a write transaction comprising a write address range, a write transaction size value, and data, wherein the write transaction was generated by an application executing on the SoC and requiring ECC protected data;
    determining with the ECC block to store the data in a first of the one or more ECC regions;
    generating ECC bits and interleaving the generated ECC bits with the data;
    increasing the write transaction size value and increasing the write address range to accommodate the interleaved ECC bits and data;
    sending the increased write transaction size value, the increased write address range, and the interleaved ECC bits and data to the memory device; and
    writing the interleaved ECC bits and data to the first of the one or more ECC regions of the memory device.

2. The method of claim 1, wherein the SoC further includes a memory controller in communication with the ECC block and the memory device, and writing the interleaved ECC bits and data to the first of the one or more ECC regions comprises sending the interleaved ECC bits and data from the ECC block to the memory controller.

3. The method of claim 1, wherein defining one or more ECC regions further comprises:
    dynamically defining one or more ECC regions based in part on the application requiring ECC protected data beginning to execute on the SoC.

4. The method of claim 1, wherein the write transaction size value is doubled, the write address range is doubled, and the ECC bits are generated for each 1 Byte block of the data.

5. The method of claim 1, further comprising:
    receiving at a read logic of the ECC block a read transaction, the read transaction comprising a read address range and a read transaction size value;
    determining with the read logic whether the read address range corresponds to one of the one or more ECC regions in the single memory device; and
    responsive to the determination by the read logic:
        increasing the read transaction size value with the read logic, increasing the read address range with the read logic, and sending the increased read transaction size value and increased read address range to the single memory device if the read address range corresponds to one of the one or more ECC regions, or
        sending the received read address range and received transaction size if the read address range does not correspond to one of the one or more ECC regions.

6. The method of claim 5, wherein increasing the read transaction size comprises doubling the received read transaction size and increasing the read address range comprises doubling the received read address range.

7. The method of claim 5, further comprising:
    receiving at a data return logic of the ECC block a return read transaction, the return read transaction comprising return data retrieved from the single memory device, a return transaction size value, and a return address range;
    determining with the data return logic whether the return address range corresponds to one of the one or more ECC regions in the single memory device; and
    responsive to the determination by the data return logic:
        decreasing the return transaction size value with the return logic, decreasing the return address range with the return logic, performing error correction using ECC bits in the return data to generate corrected data, and sending the corrected data to a requesting component residing on the SoC if the return address range corresponds to one of the one or more ECC regions, or
        sending the return data to the requesting component if the return address range does not correspond to one of the one or more ECC regions.

8. The method of claim 1, wherein the single memory device comprises a double-data rate (DDR) dynamic random access memory (DRAM).

9. A system for implementing error correction control (ECC), the system comprising:
    a memory device with one or more ECC regions and one or more non-ECC regions defined within the memory device;
    a system on a chip (SoC) coupled to the memory device; and
    an ECC block on the SoC, the ECC block in communication with the one or more ECC regions, the ECC block including logic configured to:
        receive a write transaction comprising a write address range, a write transaction size value, and data, wherein the write transaction was generated by an application executing on the SoC and requiring ECC protected data;
        determine whether to store the data in a first of the one or more ECC regions;
        generate ECC bits and interleave the generated ECC bits with the data;
        increase the write transaction size value and increase the write address range to accommodate the interleaved ECC bits and data;
        send the increased write transaction size value, the increased write address range, and the interleaved ECC bits and data to the memory device; and
        write the interleaved ECC bits and data to the first of the one or more ECC regions.

10. The system of claim 9, further comprising:
    a memory controller of the SoC, the memory controller in communication with the ECC block and the memory device, wherein writing the interleaved ECC bits and data to the first of the one or more ECC regions comprises sending the interleaved ECC bits and data to the memory controller.

11. The system of claim 9, wherein the one or more ECC regions are dynamically defined based in part on the application requiring ECC protected data beginning to execute on the SoC.

12. The system of claim 9, wherein the logic is configured to double the write transaction size value, double the write address range, and generate the ECC bits for each 1 Byte block of the data.

13. The system of claim 9, wherein the ECC block further includes read logic configured to:
receive a read transaction, the read transaction comprising a read address range and a read transaction size value;
determine whether the read address range corresponds to one of the one or more ECC regions in the memory device; and
responsive to the determination:
increase the read transaction size value, increase the read address range, and send the increased read transaction size value and increased read address range to the memory device if the read address range corresponds to one of the one or more ECC regions, or
send the received read address range and received transaction size if the read address range does not correspond to one of the one or more ECC regions.

14. The system of claim 13, wherein increasing the read transaction size comprises doubling the received read transaction size and increasing the read address range comprises doubling the received read address range.

15. The system of claim 13, wherein the ECC block further includes data return logic configured to:
receive a return read transaction, the return read transaction comprising return data retrieved from the memory device, a return transaction size value, and a return address range;
determine whether the return address range corresponds to one of the one or more ECC regions in the memory device; and
responsive to the determination:
decrease the return transaction size value, decrease the return address range, perform error correction using ECC bits in the return data to generate corrected data, and send the corrected data to a requesting component residing on the SoC if the return address range corresponds to one of the one or more ECC regions, or
send the return data to the requesting component if the return address range does not correspond to one of the one or more ECC regions.

16. The system of claim 9, wherein the memory device comprises a double-data rate (DDR) dynamic random access memory (DRAM).

17. A computer program product comprising a non-transitory computer usable medium having a computer readable program code embodied therein, said computer readable program code adapted to be executed to implement a method for implementing error correction control (ECC), the method comprising:
defining, in a single memory device, one or more ECC regions and one or more non-ECC regions, the memory device coupled to a system on a chip (SoC);
providing an ECC block on the SoC, the ECC block in communication with the one or more ECC regions in the memory device;
receiving at a write logic of the ECC block a write transaction comprising a write address range, a write transaction size value, and data, wherein the write transaction was generated by an application executing on the SoC and requiring ECC protected data;
determining with the ECC block to store the data in a first of the one or more ECC regions;
generating ECC bits and interleaving the generated ECC bits with the data;
increasing the write transaction size value and increasing the write address range to accommodate the interleaved ECC bits and data;
sending the increased write transaction size value, the increased write address range, and the interleaved ECC bits and data to the memory device; and
writing the interleaved ECC bits and data to the first of the one or more ECC regions.

18. The computer program product of claim 17, wherein the SoC further includes a memory controller in communication with the ECC block and the memory device, and writing the interleaved ECC bits and data to the first of the one or more ECC regions comprises sending the interleaved ECC bits and data from the ECC block to the memory controller.

19. The computer program product of claim 17, wherein defining one or more ECC regions further comprises:
dynamically defining one or more ECC regions based in part on the application requiring ECC protected data beginning to execute on the SoC.

20. The computer program product of claim 17, wherein the write transaction size value is doubled, the write address range is doubled, and the ECC bits are generated for each 1 Byte block of the data.

21. The computer program product of claim 17, the method further comprising:
receiving at a read logic of the ECC block a read transaction, the read transaction comprising a read address range and a read transaction size value;
determining with the read logic whether the read address range corresponds to one of the one or more ECC regions in the single memory device; and
responsive to the determination by the read logic:
increasing the read transaction size value with the read logic, increasing the read address range with the read logic, and sending the increased read transaction size value and increased read address range to the single memory device if the read address range corresponds to one of the one or more ECC regions, or
sending the received read address range and received transaction size if the read address range does not correspond to one of the one or more ECC regions.

22. The computer program product of claim 21, wherein increasing the read transaction size comprises doubling the received read transaction size and increasing the read address range comprises doubling the received read address range.

23. The computer program product of claim 21, the method further comprising:
receiving at a data return logic of the ECC block a return read transaction, the return read transaction comprising return data retrieved from the single memory device, a return transaction size value, and a return address range;
determining with the data return logic whether the return address range corresponds to one of the one or more ECC regions in the single memory device; and
responsive to the determination by the data return logic:
decreasing the return transaction size value with the return logic, decreasing the return address range with the return logic, performing error correction using ECC bits in the return data to generate corrected data, and sending the corrected data to a requesting component residing on the SoC if the return address range corresponds to one of the one or more ECC regions, or sending the return data to the requesting component if the return address range does not correspond to one of the one or more ECC regions.

24. The computer program product of claim 17, wherein the single memory device comprises a double-data rate (DDR) dynamic random access memory (DRAM).

* * * * *